United States Patent [19]

Krüger

[11] Patent Number: 4,686,465
[45] Date of Patent: Aug. 11, 1987

[54] PROBE ASSEMBLY FOR CIRCUIT-BOARD TESTER

[75] Inventor: Gustav Krüger, Herrenberg, Fed. Rep. of Germany

[73] Assignee: Feinmetall GmbH, Herrenberg, Fed. Rep. of Germany

[21] Appl. No.: 743,671

[22] Filed: Jun. 11, 1985

[30] Foreign Application Priority Data

Jun. 12, 1984 [DE] Fed. Rep. of Germany ....... 3421799

[51] Int. Cl.⁴ ...................... G01R 1/067; G01R 1/073
[52] U.S. Cl. ................................ 324/158 P; 439/482
[58] Field of Search ............... 324/158 P, 158 F, 72.5, 324/73 PC; 339/252 R, 255 R, 108 TP; 329/149

[56] References Cited

U.S. PATENT DOCUMENTS 4,535,536 8/1985 Wyss ......................... 324/73 PC X

FOREIGN PATENT DOCUMENTS 3312436 5/1984 Fed. Rep. of Germany ... 324/158 P
3340184 5/1985 Fed. Rep. of Germany ... 324/158 F
589947 7/1977 Switzerland ..................... 324/158 P

OTHER PUBLICATIONS

IBM Technical Disclosure Bulletin, Arnhart, J. et al., "Module Connector", vol. 19, No. 1, Jun. 1976, pp. 125-126.

*Primary Examiner*—Reinhard J. Eisenzopf
*Assistant Examiner*—S. Baker
*Attorney, Agent, or Firm*—Erwin S. Teltscher

[57] ABSTRACT

A probe assembly for testing at least partially conductive elements has a dielectric base plate, a plurality of conductive supports on the base plate generally insulated from each other thereby, and each having a forwardly open socket having a forwardly concave socket surface, and a plurality of conductive contact rods, each having a substantially part-spherical rear ball end having an outer surface, and resting in a respective one of the sockets, and a forwardly directed front test end. According to the invention one of the surfaces is formed with at least one edge engaging only in line contact with the other surface. Thus, when the tips are engaged with conductive regions of an element to be tested, electrical connection can be made at the region of line contact between the contact rod and support.

20 Claims, 6 Drawing Figures

PROBE ASSEMBLY FOR CIRCUIT-BOARD TESTER

FIELD OF THE INVENTION

The present invention relates to a probe assembly of the type used to test a conductive element. More particularly this invention concerns a probe assembly that is used to test printed-circuit boards.

BACKGROUND OF THE INVENTION

A printed-circuit board is a dielectric plate carrying on one or both faces a network of lines of a conductive material such as copper that are either printed on the plate or created by etching out the copper between the lines on a completely copper-plated plate. The board is drilled at the conductive lines to create holes that allow the leads of circuit elements to be soldered in place and that allow if necessary connection to be made from a line on one face of the board to a line on the opposite face. Before circuit elements are soldered to the board it is necessary to test it, both to ascertain that each of the lines is electrically continuous, and to verify that there are no unwanted connections between lines that are supposed to be electrically independent. Any error whatsoever of continuity or discontinuity makes the board unusable, a reject.

The testing apparatus has a probe assembly with a multiplicity of finger-like contacts whose tips are simultaneously brought into contact with the various lines. The contacts are arrayed such that one contact engages each end of each conductive line or the end of any extension thereof.

To accommodate different sizes of boards the support board of the probe assembly is provided with a multiplicity of densely spaced depressible supports. A tight grid of such supports is provided, with the supports independently connected to an electronic test and analyzing device, and the grid is at least as large as the largest board to be tested. Thus when the board to be tested and the array of supports are juxtaposed, there will be at least one support generally aligned with the end of every line or segment thereof as well as with any bores in the board. The contacts are rods supported on those supports which lie generally in the right position relative to the locations to be contacted. Only those contacts needed for a specific test are mounted on supports, and a mask is provided to orient the forward ends of the contact rods appropriately for the specific board being tested. The supports allow the contact rods to be depressed back into the probe assembly so that when the board is passed back or the assembly is pressed up against the board the contacts will all bear with a certain standard pressure against the points being tested, thereby making the resistance at the interface between the front end of the contact and the line being tested uniform for all the contacts.

In order to permit the contacts to cant somewhat so they can be tipped to conform to a particular pattern it is standard to form their rear ends, that is their ends turned away from the sample being tested, as mainly spherical balls and to receive them in conical or frustoconical seats on the front ends of the depressible supports. In this manner the extent of contact will be the same even if the axis of the contact rod is not coaxial with the movement axis of the depressible support.

The socket of such an arrangement therefore has a contact surface that is highly susceptible to getting dirty in use. The contact rods sit in these sockets and in fact are only retained therein by the force of gravity. Thus the sockets open upward and readily receive and dirt or the like filtering down from above through the perforated mask. Once the surface gets dirty or corrodes somewhat the contact resistance at this critical joint between the contact and its support increases greatly. This nearly open circuit at this joint can therefore cause the testing apparatus to read as open-circuited a line or connection of the circuit board and cause the board to be rejected, as only error-free boards are used.

It is to be noted that a probe assembly normally includes a large number of respective identical contact elements, whose plungers are disposed parallel to one another therewithin according to a predetermined and normally very fine grid or pattern. The plungers are spring-loaded and movable in an axial direction. The probe assembly is operatively so arranged that the plungers are vertically disposed and that the upright contact rods are carried thereby. Here the ball joint of each contact element may be held together by gravity acting on the contact rod, so that no additional measures are necessary to hold the ball joint of each contact element together. While all plungers in a probe assembly may be located in the corresponding grid, and may be present permanently, a corresponding number or a lesser number of contact rods may be located in the through-going bores of a longitudinally movable guide plate in accordance with the requirements of the respective conductive plates to be contacted. But the test contacts of a conductive plate, which are to be contacted simultaneously by the contact rods, are frequently not disposed in a pattern corresponding to that of the plunger grid. Furthermore, the number of the test contacts is frequently less than the number of the points in the grid occupied by the plungers. Consequently the ball joints make it possible to deflect or pivot the contact rods from the grid of the plungers so that they assume a somewhat inclined position, thus deviating from the vertical. For each type of conductive plate to be tested there is then prepared a guide plate having through-going bores for the contact rods, namely in correspondence with the test points to be examined or tested. Subsequently the guide plate is installed in the probe assembly, thereafter the contact rods are inserted into the bores of the guide plate, and then allowed to fall onto the nearest plunger by the action of gravity. The test point of a conductive plate is defined as a location in such a conductive plate or the like which is to be contacted by the respective contact element. Thus this may relate to a location in a conductive track, to a contact sleeve, and the like. The invention relates in particular to contact elements for probe assemblies of the aforedescribed type.

OBJECTS OF THE INVENTION

It is therefore an object of the present invention to provide an improved probe assembly for an electrical tester.

Another object of the present invention is the provision of such a probe assembly for an electrical tester which is particularly aimed at the continuity testing of printed circuits, and which overcomes the above-described disadvantages.

A yet further object of the present invention is to ensure that the electrical contact between the contact rod and the support socket of the ball joint is more or less insensitive to any contamination, so that the electrical contact or junction resistance between the contact rod and the support socket remains relatively low for long operative periods.

SUMMARY OF THE INVENTION

These objects are attained, according to the invention, by a probe assembly for testing at least partially conductive elements, which has a dielectric base plate, a plurality of conductive supports on the base plate generally insulated from each other thereby, and wherein each has a forwardly open socket having a forwardly concave socket surface, and a plurality of conductive contact rods, each having a substantially part-spherical rear ball end having an outer surface, and resting in a respective one of the sockets, and a forwardly directed front test end. One of the surfaces is formed with at least one edge engaging only in line contact with the other surface.

Thus when the tips are engaged with conductive regions of an element to be tested, electrical connection can be made at the region of line contact between the contact rod and support. Due to that line contact between the at least one edge of the socket and/or the part-spherical ball of the contact rod, the electrical contact or junction resistance between the ball and the socket remains low over long periods of time, or even remains permanently low. In this manner erroneous test results, as are caused between the ball and the socket by, for example, a non-controllable severe increase of the electrical junction or contact resistance between the ball and socket, or even by interruption of the electrical connection, are avoided, or at worst appear only after very long operating periods, compared to comparable causes of the prior art. Furthermore the low transition resistance during the operating time either does not change, or changes relatively slowly. Such a structure is simple in construction, is cost-effective, and increases the operating life of the probe assembly.

In general it is advantageous if the contact rod and the plungers each are made in one metallic piece, and if they are optionally galvanically coated over their entire surface or over selected locations; thus the contact surface of the contacting rod and the socket may be gold plated. Optionally the contact rod and/or the plungers may be made of several parts.

The edges provided for line contact, or segments of edges may frequently be sharp, which results in a highest degree of insensitivity with respect to contaminations. But a high degree of insensitivity with respect to contaminations can also be achieved with dull or chamfered edges, particularly if the junction resistance is small.

Advantageously the contact rod and the plungers may be susbstantially rigid, as the required degree of pivoting of the contact rod on the plunger is effected by the ball joint. Optionally, however, a spring may be braced between the plunger and a baseplate associated therewith. The contact rod and the plunger may be fabricated of any suitable metal, which is electrically adequately conductive. Metals suitable therefor are, for example, steel, brass, bronze alloys or the like.

In an advantageous development the contact junction of the socket and/or the contact edge or edges of the ball of the contact rod, and preferably also the socket and the entire ball of the contact rod, have rotation symmetry. This has the advantage of a particularly simple and cost-effective manufacture of the socket or the ball of the contact rod, and also ensures good contact and easy pivoting of the ball in the socket.

But in many cases it is advantageous if the edge or edges forming the electrical junction or junctions of the socket and/or of the ball of the contact head do not have rotational symmetry. But such a construction also permits the attainment of of uniform and low junction resistances for at least very long periods of operation, or even permanently. Manufacture of the edge or edges is simplified thereby also, and becomes more cost-effective and simpler; for example the items can be manufactured by stamping or pressing.

The socket forms preferably part of the plunger, while the ball head forms part of the contact rod. But a reverse arrangement is also conceivable. In the latter arrangement the danger exists, however, that any abrasive material from the ball-joint, as a result of its wear, may uncontrollably accumulate in the probe assembly at locations where such accumulations may give rise to disturbances. In general it is therefore preferable and more advantageous if the socket forms part of the plunger, so that it is located operatively below the contact rod supported thereby. The socket then acts as an accumulator for accumulating the worn material from the abrasive process, and the contamination resulting therefrom in the socket. During each change or replacement of the guide plate the sockets may be cleansed from contaminations by, for example, pouring them out, or blowing them from the socket.

According to a further development of the invention the socket may be formed with a central recess or forwardly open pocket within the edge for accumulating any contaminations. This has the advantage that any waste material from the ball and/or from the socket will not impair the freedom of movement of the ball joint, nor increase the electrical junction resistance, even over long time periods, namely in those difficult situations where the probe assembly must be operative during such long time periods without any change or replacement of the guide plate. Each time the contact rods are lifted off to set the device up for a new test pattern, the dirt reservoir pockets are emptied out easily. Under any circumstances they are set up so that they collect quite a bit of material to allow long times between servicings. Thus each socket surface is out of contact with the end outer surface except at the respective contact edge.

It is in general advantageous if only the contact or contacts of the socket are provided with one or more edges, and if the contact of the ball of the contact rod is preferably an annular segment of a spherical surface. In this manner a particularly uniform junction resistance may be attained, while manufacture of the ball of the contact rod is simplified. But in some cases it may even be advantageous if only the contact or contacts of the ball are formed by one or several edges.

In some cases it is also feasible and advantageous that the ball head as well as the socket have contacts formed with a chamfered edge, and wherein the line contact takes place at a thin band. Thus it may frequently be advantageous that at least one contact (socket or ball) is provided with an edge extending transverse to the peripheral direction thereof, while the other contact (ball or socket) is provided with an annular edge extending concentrically around the longitudinal axis of the ball or of the socket, which operatively abuts the erstwhile contact. In this manner the self-cleaning action of the edges due to the pivoting movements of the contact rods arising during operation becomes particularly intensive, and a uniform junction resistance is attained for a long period of time or permanently.

According to another feature of this invention each socket, which like each contact rod can be made of one or several parts, is depressible along a respective axis, and the line-contact edge is centered on the respective axis. Similarly according to this invention the edge can be annular. In one arrangement each socket surface is at least frustoconical and centered on the respective axis, and the outer surface of the ball end of the respective contact rod is formed with at least one annular ridge forming the respective edge. It is also possible for the socket to be formed with at least two stepped bores forming a shoulder constituting the edge. Either way the edge can simply be made by turning, stamping, or pressing.

According to another feature of this invention each line-contact edge has a plurality of independent nonannular sections. This is achieved by forming each socket with a plurality of teeth defining edges lying generally on a conical surface centered on the respective axis. The teeth and edges extend radially of the respective axes. This toothed arrangement effects a continuous scraping and scrubbing of the ball end as the system is used, keeping the contact surfaces clean.

The invention extends or covers also a support for a contact element, whose contact or contacts of its ball head or its socket are formed by at least one edge. It must be borne in mind that as the contact rods are only loosely set onto the plungers of the respective supports, the contact rods and the supports may be manufactured and sold separately, and may then be assembled by the customer into probe assemblies from complementary components, such as sockets and plungers, fabricated by the same manufacture, or other manufacturers. In general the number of contact rods is smaller than that of the supports, as a probe assembly is provided at all grid locations with supports. Subsequently only the number of contact rods needed is employed for testing the at least partially conductive elements, such as circuit boards or the like; consequently in practice only a fraction of the available plungers is provided with corresponding contact rods during the testing process.

The support of the contact element serves primarily for resiliently carrying the contact rod. In its simplest form it is merely constituted by the plunger. Alternatively it can be implemented as a cylinder and a spring braced between the plunger and the base plate of the cylinder, although it may alternately be implemented in still other forms.

DESCRIPTION OF THE DRAWING

The above and other features and advantages of the invention will become more readily apparent from the following it being understood that any feature described with reference to one embodiment of the invention can be used where possible with any other embodiment. In the accompanying drawing.

DESCRIPTION OF THE PREFERRED EMBODIMENTS

Figure 1:
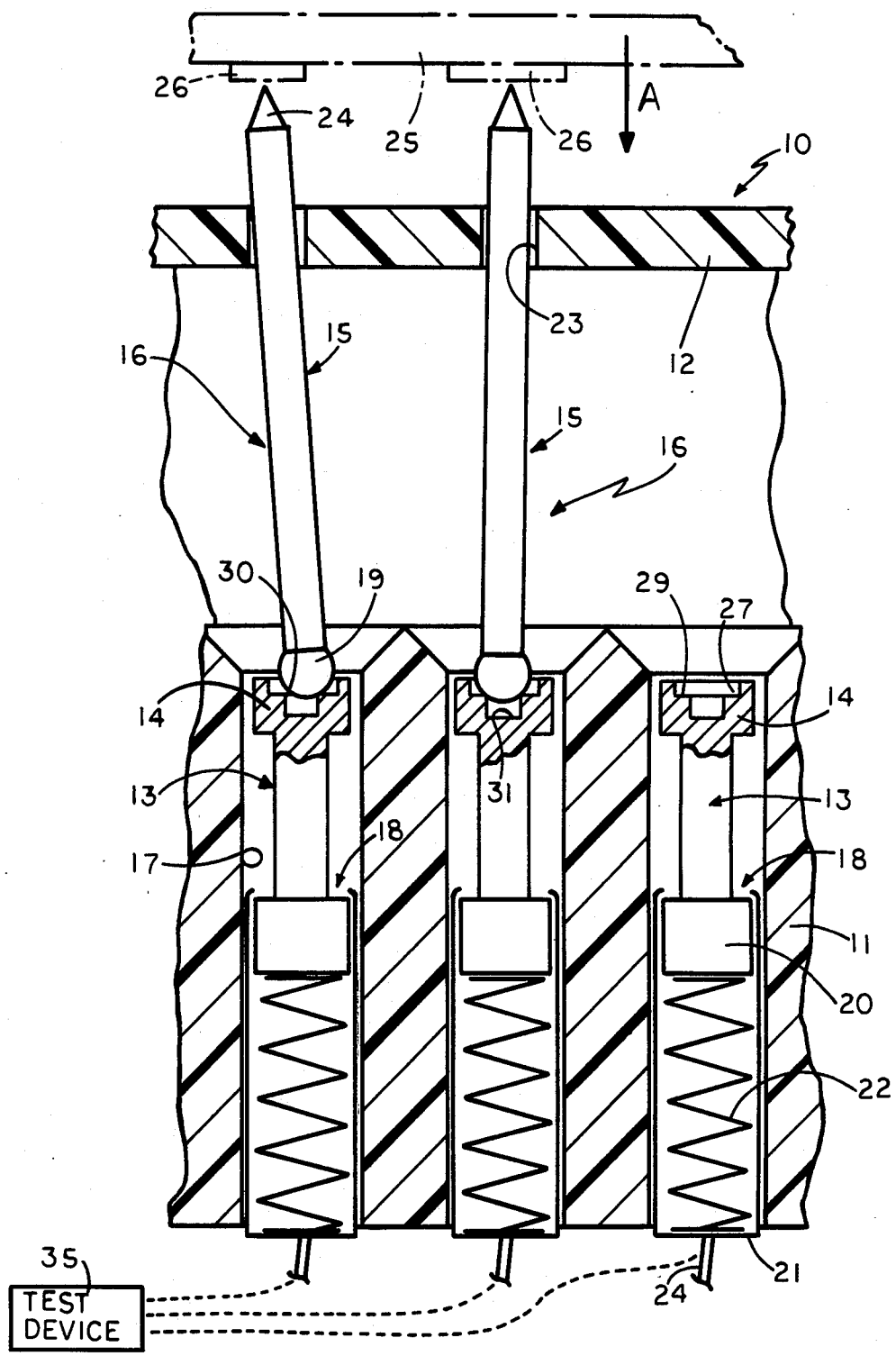
FIG. 1 is a large-scale section through the test probe assembly according to this invention.

The probe assembly, of which only a small segment in longitudinal section is shown in FIG. 1, includes a base plate 11, a replaceable guide plate 12 and a plurality of axially resilient, metallic supports 18 having metallic plungers 13, which may be converted into contact elements 16 by, for example, metallic contact rods 15 received in sockets 14 of the plungers 13.

The base plate 11 is formed with a dense array of vertical bores 17 disposed parallel to one another, each having a diameter from about 1 mm to about 3 mm for receiving respective supports 18. Each bore 17 is conically chamfered near the opening facing the guide plate 12 to facilitate introduction of the ball head 19 of a respective contact rod 15. Cylindrical guide sleeves 21 of the supports 18 are fixedly received in respective bores 17.

The guide plate 12 and the base plate 11 are made of electrically insulating material.

The vertically disposed plungers 13 are resiliently supported and movable in respective vertically disposed cylindrical sleeves 21, by each lower region or rear end 20 of a plunger 13 being linearly guided in the cylindrical sleeve 21. Each plunger 13 is resiliently supported by a spring 22 braced between the closed floor of the cylindrical sleeve 21, and the plunger itself, and is normally urged upwardly by the spring 22 assuming the position shown in FIG. 1. The front end of the sleeve 21 is bent in to confine the enlarged rear end 20 of the plunger 13, so that the same is captured in the sleeve 21, cannot be pushed forwardly therefrom along the axis of the sleeve 21 and bore 17, but can be depressed axially back in the sleeve 21 while compressing the spring 22. Each plunger 13 is advantageously made of a single piece.

As seen in FIG. 1 two metallic contact rods 15 engage with their three-quarter spherical ball heads 19 two respective frontally disposed recesses of the sockets 14 of the vertically movable plungers 13. A downwardly directed movement of each contact rod 15 causes a corresponding downward movement of a plunger 13. Each contact rod 15 is linearly guided in a corresponding bore 23 of the guide or dielectric mask plate 12, but is allowed sufficient play so that it may assume also an inclined position as a result of being provided with a ball joint consisting of the ball head 19 and its associated socket 14. The contact rod 15 may therefore be made rigid. The ball joints of the contact elements 16, consisting of elements 14 and 19, thus permit lateral displacements of the bores 23 with respect to their nearest respective plungers 13, as shown in the examples of FIG. 1.

The bores 23 in the dielectric mask or guide plate 12 are generally in alignment with the locations of the circuit board 25 to be tested. For each type of circuit board having specific locations to be tested, there is provided a corresponding guide plate 12. If the type of circuit board used is to be replaced, a new guide plate 12 is inserted into the probe assembly 10. The base plate 11 as well as the guide plate 12 are fixedly arranged on non-illustrated rigid carrying members of the probe assembly, and are fixedly arranged with respect to one another.

The support 18 and the contact rod 15 carried thereby form a metallic, resilient contact element 16, which in turn is in its entirety a through-going electrical conductor of low resistivity connected with a lower end thereof through a conductive wire 24 to a test device 35, and connected with an upper end thereof through a pointed tip 24' of its contact rod 15 to a test point 26 of a circuit board 25. The conductive wire 24 may, for example, be soldered to a bottom contact surface of the cylindrical sleeve 24. Current therefore flows through the tip 24' pressed downwardly by the circuit board 26, the contact rod 15 exerting pressure against the resilient spring 22, down to the bottom surface of the cylindrical sleeve 21. The fact that the metallic plunger 13 may slide in the cylindrical sleeve 21 poses no problem, since the plunger 13 makes good electrical contact with the metallic cylinder 21, and furthermore the pressure of the metallic compression spring 22 ensures a good electrical contact between the plunger 13 and the cylindrical sleeve 21.

So as also to ensure a good electrical contact between the ball head 19 and the socket 14, which renders it insensitive to contaminations, in the example illustrated the concave ball-receiving seat 27 of the socket is formed as a surface of revolution centered on a respective axis of the metallic contact rod 15. As seen in FIG. 1 the seat 27 of each socket 14 is formed by a pair of coaxial bores 29 and 31. The bore 29 is substantially greater in diameter than the bore 31, and these bores meet at a very sharp edge 30 at which they engage the respective ball end 19. Thus there will be circularly annular line contact between the plunger 13 and the metallic contact rod 15, even if the contact rod 15 is somewhat canted to the respective rod axis. Such line contact is self-cleaning, and ensures that it will not corrode or foul up with time, as each test causes some slight shifting between the ball and the edge 30 to renew and maintain good electrical contact between them. Thus the junction resistance remains largely constant between the ball head 19 and the socket 14, even during long periods of operation. The ball 19 is at least given some galvanic protection, such as by gold-plating it, to minimize corrosion. The bore 31 also acts as a trap for any grit or dust that finds its way into the system. The size of this bore 31 allows quite a bit of material to build up without interfering with the seat of the ball 19 in the seat 27. During each change of the guide plate 12 the accumulated waste material may be removed. The edge 30 may optionally be chamfered, instead of being sharp, but forms in either case the pivoting line or surface about which the ball 19 can pivot.

In use the board 25 to be tested is pressed down in direction A against the probe assembly 10. As the conductive strips 26 engage the tips 24', which will be at slightly different heights due to the varying inclination of the contact rods 15, the contact rods 15 and the respective plungers 13 will be pushed down also, until all of the contact rods 15 bear on the respective conductive strips 26. The distance any of the contact rods 15 is depressed is short compared to the length of the respective spring 22, so that all of the contact rods 15 will bear forwardly on the location 16 and backward on the respective socket 14 with substantially the same force. In addition the tips 24' are pointed so the fact that a contact rod 15 does not engage the board 25 perpendicularly has little effect on the size of the contact interface between the front end or tip 14' of the contact rod 15 and the conductive strip 26 engaged thereby.

Figure 2:
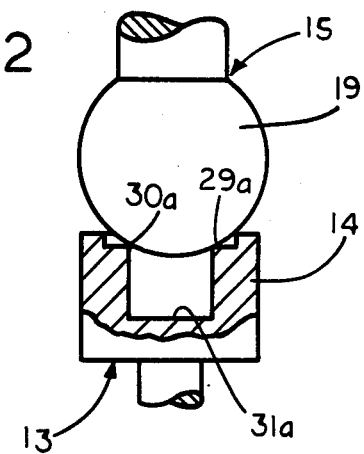
FIGS. 2, 3, 4 and 5 are large scale detail views of variants of the system of this invention.

In FIG. 2 is shown a large-scale section through a ball joint according to a further embodiment of the invention, which also results in a pivoting contact between the contact rod 15 and a plunger 13, which otherwise may correspond to the embodiment shown in FIG. 1, which also applies to the embodiments shown in FIGS. 3-6. In FIG. 2 the outer large-diameter is larger than in FIG. 1, and wherein the smaller back counterbore 31a is axially substantially longer. Instead of providing a sharp edge 30a, it is also possible to provide a chamfered edge 29 which engages the ball 19 over a narrow annular band, which type of contact is also considered to be line contact for the purposes described here. This arrangement works substantially the same as that of FIG. 1, but the reservoir for dirt and the like formed by the bore 31a is substantially larger in volume.

Figure 3:
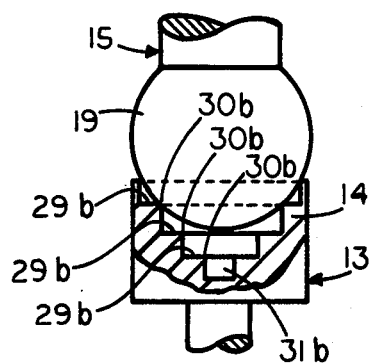

The embodiment of FIG. 3 differs from that of FIGS. 1 and 2 essentially by the fact that three outer stepped bores 29b, 29b' and 29b" form three sharp edges 30b, 30b' and 30b" with each other, respectively, and with a single end bore 31b, a shoulder being defined between adjoining edges. In this embodiment the socket 14, as do the sockets of the embodiments of FIGS. 1 and 2, has a symmetry of rotation with respect to its longitudinal axis. The different three diameters of the respective bores 29b, 29b' and 29" makes it possible to use this arrangement for balls 19 of different diameters, with a ball 19 of smallest diameter sitting on the lowermost edge 29". Each ball 19 is, of course, secured as usual, to its contact rod 15.

Figure 4:
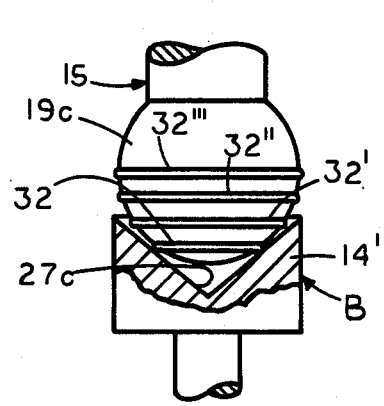

In the embodiment according to FIG. 4 the socket 14' is formed as a frustoconical surface, and lacks an edge designed to make contact with a ball head 19c of the contact rod 15. Although the socket 14' is formed with an upper edge, the upper edge does not come into contact with the ball head 19c. Rather the ball head 19c is formed with four circularly annular and parallel ridges 32, 32', 32" and 32'", which again have rotation symmetry with respect to the axis of its contact rod 15. In the example shown, however, only the two lowermost ridges 32 and 32' make contact with the seat 27c, due to the relatively small pivoting angle prevailing during operation of the probe assembly. The ridges 32" and 32'" are provided so that the ball head may also be used with sockets 14' having larger diameters than the one shown in FIG. 4.

Instead of the conical recess 27c shown in FIG. 4 it is also possible to provide a recess of a different configuration, preferably a cup-shaped recess, and wherein advantageously then only a single ridge, such as ridge 32, is provided, which may advantageously be formed with indentations, through which dirt and dust may fall to the bottom or floor of the cup-shaped recess. That recess may again be advantageously formed with a center pit, for example in the form of a circular bore, so as to receive any waste material, similar to the reservoir 31a of FIG. 2.

Figure 5:
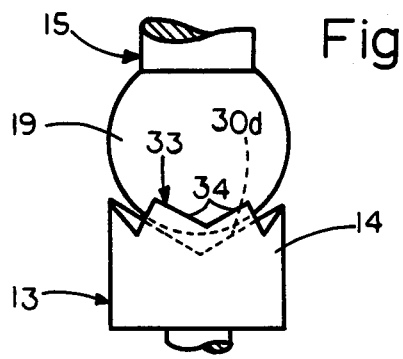
Figure 6:
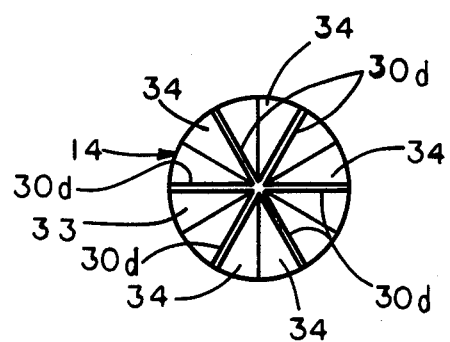
FIG. 6 is a top plan view of the socket structure of FIG. 5.

In the system of FIGS. 5 and 6 the ball head 19 is again part of a sphere, i.e. similar to the embodiment of FIGS. 1-3, and has a smooth surface. The socket 4 is here formed, however, with six radially extending angled teeth 33 having axially forwardly flaring flanks 34 that meet at a plurality of radially extending and angularly equispaced edges 30d, that lie on a conical surface centered on the longitudinal axis of the socket.

The teeth 34 are equally distributed and their apices are straight, being the end points, so to speak, of the edges 30d, which, in fact form very thin strips, thus providing virtual line contact with the ball head 19. The strips can be made arbitrarily thin, forming line edges in the extreme case. The ball head 19 may again be pivotably supported by the edges 30d. Instead of the straight-formed radially extending teeth, it is also possible to employ teeth of different shapes, for example matched to the curvature of the ball head 19, or helically shaped teeth or the like.

While the invention has been illustrated in several preferred embodiments, it is not limited to the specific members and structures shown, since many variations thereof will be evident to one skilled in the art and are intended to be encompassed in the present invention as set forth in the following claims.

I claim:

1. A probe assembly for testing at least partially conductive elements, the assembly comprising:
   a dielectric base plate;
   a plurality of conductive supports on the base plate generally insulated from each other thereby, and each having a forwardly open socket having a forwardly concave socket surface; and
   a plurality of conductive contact rods, each having a substantially part-spherical rear ball end having an outer surface, and resting in a respective one of the sockets, and a forwardly directed front test end including a tip, one of the surfaces being formed with at least one edge engaging only in line contact with the other surface, whereby, when the tips are engaged with conductive regions of an element to be tested, electrical connection is made at the region of line contact between the contact rod and a corresponding support.

2. The probe assembly defined in claim 1 wherein each socket is depressible along a respective axis and the line-contact edge is centered on the respective axis.

3. The probe assembly defined in claim 2 wherein the edge is annular.

4. The probe assembly defined in claim 3 wherein each socket surface is at least frustoconical and centered on the respective axis and the outer surface of the ball end of the respective contact rod is formed with at least one annular ridge forming the respective edge.

5. The probe assembly defined in claim 3 wherein the socket is formed with at least two stepped bores forming a shoulder constituting the edge.

6. The probe assembly defined in claim 2 wherein each line-contact edge has a plurality of independent nonannular sections.

7. The probe assembly defined in claim 6 wherein each socket is formed with a plurality of teeth defining edges lying generally on a conical surface centered on the respective axis.

8. The probe assembly defined in claim 1 wherein the socket is formed with a plurality of such edges which are annular, of different diameters, and generally concentric.

9. The probe assembly defined in claim 1 wherein the support includes a plunger resiliently supported within said support.

10. The probe assembly defined in claim 1, further comprising
    a mask plate formed with perforations through which the contact rods extend and out of exact alignment with at least some of the respective supports.

11. The probe assembly defined in claim 1 wherein the contact rod is rigid.

12. A conductive contact rod, wherein a plurality of said conductive contact rods are used in connection with a probe assembly for testing at least partially conductive elements, and wherein the probe assembly includes a dielectric base plate and a plurality of supports on the base plate generally insulated from each other thereby, and wherein each support includes a forwardly open socket having a forwardly concave socket surface, said conductive contact rod comprising:
    a part-spherical rear ball end having an outer surface, and
    a forwardly directed front test end, including a tip, said part-spherical rear ball being adapted to rest in a respective one of said open sockets, the outer surface of said part-spherical rear ball being formed with at least one edge adapted to engage only in line contact with a corresponding socket surface, so that when the tips are engaged with conductive regions of an element to be tested, electrical connection is made at the region of line contact between the contact rod and a corresponding support.

13. A support in connection with a probe assembly for testing at least partially conductive elements with the aid of a plurality of said supports, and wherein the probe assembly includes a dielectric base plate, and a plurality of conductive contact rods, each contact rod including a substantially part-spherical rear ball end having an outer surface, and a forwardly directed front test end including a tip, said support comprising:
    a conductive hollow cylinder, and
    a plunger resiliently supported at least partly within said cylinder, and including a forwardly open socket having a forwardly concave socket surface,
    said supports being adapted to be insulated from one another by said base plate,
    said concave socket surface being formed with at least one edge and adapted to engage only in line contact with said outer ball surface, whereby, when the tips are engaged with conductive regions of an element to be tested, electrical connection is made at the region of line contact between the contact rod and a corresponding support.

14. The probe assembly defined in claim 7, wherein the teeth and edges extend radially of the respective axes.

15. The probe assembly defined in claim 1, wherein the socket is formed with a forwardly open pocket within the edge, whereby dirt and the like can collect in this pocket out of contact with the respective ball end.

16. The probe assembly defined in claim 1, wherein each socket surface is out of contact with the end outer surface except at the respective contact edge.

17. The probe assembly defined in claim 1, wherein the edge is sharp.

18. The probe assembly defined in claim 1, wherein the edge is chamfered.

19. The probe assembly defined in claim 1, wherein the one surface is formed with only one such edge.

20. A probe assembly for testing at least partially conductive elements, the assembly comprising,
    a dielectric base plate;
    a plurality of conductive supports on the base plate, generally insulated from each other thereby, each defining an axis, and each having a forwardly open socket having a forwardly concave socket surface, which is at least frustoconical and centered on the respective support axis, each socket being depressible about a respective of said axes, and
    a plurality of conductive contact rods, each having a substantially part-spherical rear ball, and having an outer surface formed with at least one annular edge engaging only in line contact with the corresponding concave socket surface, each line contact edge being centered about a respective of said axes, each contact rod having a forwardly directed front test end, including a tip, whereby, when the tip is engaged with conductive regions of said elements to be tested, electrical connection is made at the region of said line contact, and remains thereat, even when the contact rod is somewhat canted, an electrical junction resistance between each contact rod and the corresponding socket being substantially insensitive to any contamination, and therefore remaining relatively low for long operative periods.

* * * * *